(12) United States Patent
Chen

(10) Patent No.: US 8,254,141 B2
(45) Date of Patent: Aug. 28, 2012

(54) CIRCUIT BOARD CAPABLE OF LOADING HIGH ELECTRICAL CURRENT

(76) Inventor: Tsan-Chi Chen, Chung Ho (TW)

(*) Notice: Subject to any disclaimer, the term of this patent is extended or adjusted under 35 U.S.C. 154(b) by 394 days.

(21) Appl. No.: 12/656,798

(22) Filed: Feb. 17, 2010

(65) Prior Publication Data
US 2011/0199743 A1 Aug. 18, 2011

(51) Int. Cl.
*H01R 9/00* (2006.01)

(52) U.S. Cl. ........ 361/775; 361/611; 361/624; 361/637; 174/72 B; 174/71 B; 174/88 B; 174/70 B

(58) Field of Classification Search ............. 361/775, 361/776, 600, 610, 611, 679.01, 624, 637, 361/639, 648; 174/68.2, 70 B, 71 B, 72 B, 174/88 B, 99 B, 129 B, 133 B, 149 B
See application file for complete search history.

(56) References Cited

U.S. PATENT DOCUMENTS

| | | | | |
|---|---|---|---|---|
| 6,600,658 B2 * | 7/2003 | Iwata | ............................. | 361/752 |
| 2003/0168252 A1 * | 9/2003 | Schmid et al. | ................ | 174/260 |
| 2004/0001319 A1 * | 1/2004 | Kawakita et al. | ............ | 361/715 |
| 2004/0242086 A1 * | 12/2004 | Takagi | ......................... | 439/885 |

* cited by examiner

*Primary Examiner* — Hoa C Nguyen
(74) *Attorney, Agent, or Firm* — Bacon & Thomas, PLLC

(57) ABSTRACT

The present invention is to provide a circuit board capable of loading high electrical current, which comprises an insulation plate and a plurality of conductive plates each positioned on the insulation plate by riveting. A plurality of first insertion holes of the insulation plate are aligned with a plurality of second insertion holes of the conductive plates, respectively, so that the aligned first and second insertion holes of the circuit board can be welded with a plurality of electric components (such as resistors, capacitors, fuses, etc.). Therefore, the insulation plate and each of the conductive plates can be easily combined with each other by riveting to form a finished product of the circuit board without some complicated steps including exposure, development and etching, so that the manufacturing process of the circuit board capable of loading high electrical current can be efficiently simplified.

6 Claims, 3 Drawing Sheets

CIRCUIT BOARD CAPABLE OF LOADING HIGH ELECTRICAL CURRENT

FIELD OF THE INVENTION

The present invention relates to a circuit board, more particularly to a circuit board formed by riveting a plurality of conductive plates onto an insulation plate and capable of loading high electrical current.

BACKGROUND OF THE INVENTION

Nowadays, a printed circuit board (PCB) is an electronic component widely used in an electronic product of low current (such as a mobile phone, a digital camera, a PDA, a liquid crystal display, etc.) or an industrial apparatus of high electrical current (such as an electric control device, an electric transformation device, a cooling system, a multi-way socket, a socket of extension cord, etc.). According to the survey, there are still some disadvantages existing in the manufacture and operation of common commercially-available printed circuit boards. For example, a traditional photosensitive printed circuit board is described hereinafter, wherein a semi-finished product of the printed circuit board is provided with an insulation substrate which has a surface plated with a copper foil for electrical conduction, while the copper foil is coated with a photosensitive photoresist layer thereon. Generally, the semi-finished product of the printed circuit board is processed to form a finished product thereof by an operator according to the following steps:

(1) Designing a mask of circuit patterns;

(2) Attaching the mask of circuit patterns to the photosensitive photoresist layer on a surface of the semi-finished product;

(3) Processing the semi-finished product attached with the mask of circuit patterns by an exposure process;

(4) Removing the mask of circuit patterns;

(5) Immersing the semi-finished product in a development solution to carry out a development process, so as to remove exposed portions of the photosensitive photoresist layer of the semi-finished product;

(6) Immersing the semi-finished product in an etching solution (such as ferric chloride solution) to etch exposed portions of the copper foil uncovered by the photosensitive photoresist layer, so that the remaining copper foil on the semi-finished product forms circuit patterns;

(7) Washing to remove the remaining etching solution on the semi-finished product; and (8) Drilling the semi-finished product to form connection holes for inserting other electronic components, such as resistors, capacitors, fuses and etc.

As described above, the manufacturing process of the printed circuit board comprises too many complicated steps which can not be simultaneously carried out, so that the manufacture efficiency of the printed circuit board can not be efficiently improved. In addition, because the copper foil on the printed circuit board for electrical conduction is formed on the insulation substrate by electroplating, the thickness of the copper foil is generally relatively thin. However, when the printed circuit board is applied to an industrial apparatus, the high electrical current used by the industrial equipment will cause the copper foil on the printed circuit board to generate high temperature. As a result, the printed circuit board will not be capable of loading the high electrical current and the high temperature generated by the high electrical current, resulting in damaging the printed circuit board or even causing accidental disasters. To solve the foregoing problems, there are two solutions. The first solution is to increase circuits (or jump wires) on the printed circuit board to evenly distribute the transmission pathway of the electric current. However, this solution will additionally cause the inconvenience of processing the printed circuit board and affect the appearance of the printed circuit board due to too many messy circuits. Furthermore, the second solution is to increase the thickness of the copper foil to prevent from causing the foregoing danger. However, the operator needs to use more precise electroplating equipments and more electroplating time to repeatedly execute the electroplating process for increasing the thickness of the copper foil, in order to control the copper foil to evenly and smoothly distribute on the insulation substrate. As a result, due to the second solution, the manufacture efficiency of the printed circuit board may be substantially lowered, while the manufacture cost of the printed circuit board may be increased. Thus, the competitiveness of manufacturers of the printed circuit board will be seriously affected. Therefore, it is important for related manufacturers of printed circuit boards to think how to improve the foregoing disadvantages existing in the manufacture and operation of the foregoing traditional printed circuit board.

It is therefore tried by the inventor to develop a circuit board capable of loading high electrical current to solve the problems existing in the manufacture and operation of the traditional printed circuit board, to simplify the manufacturing process of the circuit board, and to provide a capability of loading high electrical current.

BRIEF SUMMARY OF THE INVENTION

An object of the present invention is to provide a circuit board capable of loading high electrical current, which comprises an insulation plate and a plurality of conductive plates, wherein each of the conductive plates is positioned on the insulation plate by riveting. When each of the conductive plates is riveted on the insulation plate, a plurality of first insertion holes of the insulation plate are aligned with a plurality of second insertion holes of the conductive plates, respectively, so that the aligned first and second insertion holes of the circuit board can be welded with a plurality of electric components (such as resistors, capacitors, fuses, etc.). Therefore, the insulation plate and each of the conductive plates are combined with each other by riveting to form a finished product of the circuit board without some complicated steps including exposure, development and etching, so that the manufacturing process of the circuit board can be efficiently simplified. Meanwhile, a manufacturer can conveniently change and use various conductive plates having different thicknesses or current-loading capabilities according to a customer's desire or an operational environment of the circuit board (such as being applied to an electronic product of low current selected from a mobile phone, a digital camera, a PDA, an LCD and etc., or applied to an industrial equipment of high electrical current selected from an electric control device, an electric transformation device, a cooling system, a multi-way socket, a socket of an extension cord, etc.), so as to solve the foregoing problems existing in the traditional printed circuit board that can not load high electrical current and may be damaged or even accompanied with accidental disasters.

BRIEF DESCRIPTION OF THE SEVERAL VIEWS OF THE DRAWINGS

The structure and the technical means adopted by the present invention to achieve the above and other objects can be best understood by referring to the following detailed description of the preferred embodiment and the accompanying drawings, wherein.

DETAILED DESCRIPTION OF THE INVENTION

Figure 1:
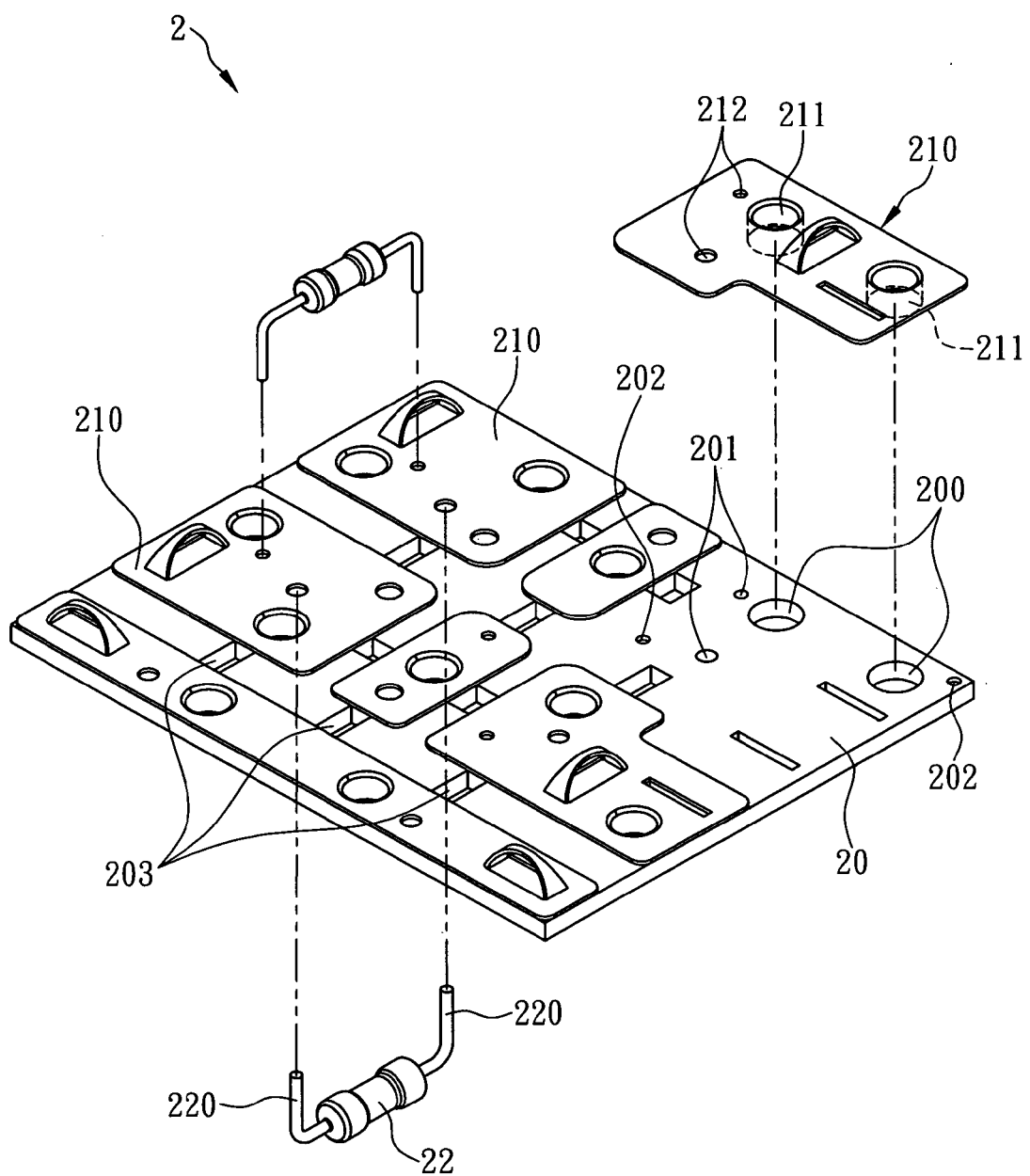
FIG. 1 is an exploded perspective view of a circuit board capable of loading high electrical current according to a preferred embodiment of the present invention.
Figure 2:
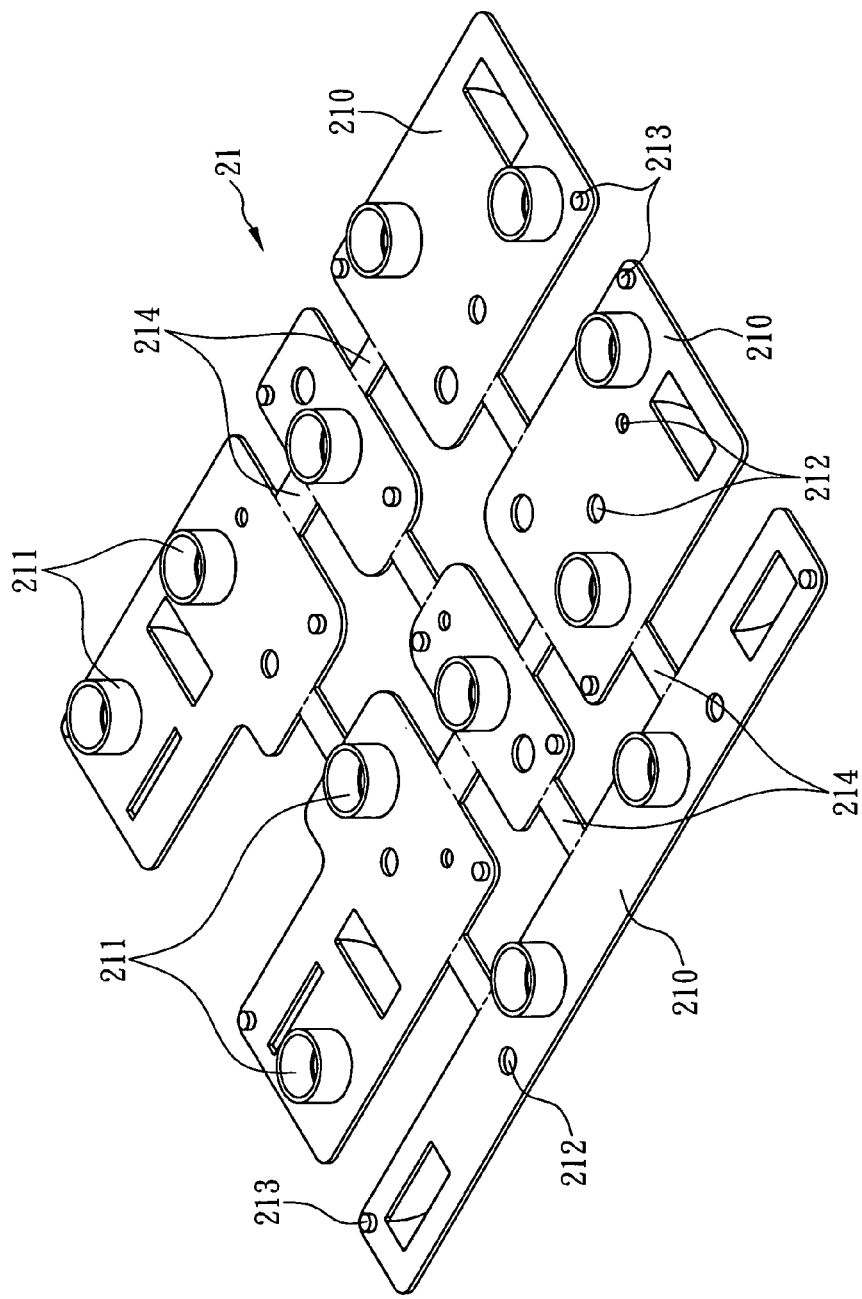
FIG. 2 is a perspective view of an uncut metal plate before being cut into conductive plates according to the preferred embodiment of the present invention.

The present invention is related to a circuit board capable of loading high electrical current. Referring now to FIG. 1, a circuit board according to a preferred embodiment of the present invention is illustrated. As shown, the circuit board designated by numeral 2 comprises an insulation plate 20 and a plurality of conductive plates 210, wherein the insulation plate 20 is evenly formed with a plurality of first riveting portions 200 (such as riveting holes or riveting posts) and a plurality of first insertion holes 201. Each of the conductive plates 210 is formed by punching and cutting a metal plate 21 (as shown in FIG. 2), and each of the conductive plates 210 is formed with at least one second riveting portion 211 (such as riveting posts or riveting holes). Each of the second riveting portions 211 can be matched with each of the first riveting portions 200 to combine with each other, so that each of the conductive plates 210 can be positioned on the insulation plate 20 by riveting. Each of the conductive plates 210 further comprises at least one second insertion hole 212, and each of the second insertion holes 212 is aligned with each of the corresponding first insertion holes 201. Furthermore, the shape of each of the second insertion holes 212 is matched with that of each of the corresponding first insertion holes 201, so that each of the first and second insertion holes 201, 212 of the circuit board 2 can be welded with a plurality of electric components 22, such as resistors, capacitors, fuses, etc.

As a result, because each of the conductive plates 210 is positioned on the insulation plate 20 by riveting, a manufacturer can conveniently change and use various conductive plates having different thicknesses or current-loading capabilities according to a customer's desire or an operational environment of the circuit board 2 (such as being applied to an electronic product of low current selected from a mobile phone, a digital camera, a PDA, an LCD, etc., or applied to an industrial equipment of high electrical current selected from an electric control device, an electric transformation device, a cooling system, a multi-way socket, a socket of an extension cord, etc.), so as to customize various circuit boards 2 capable of loading high electrical current. Thus, the circuit boards 2 can efficiently load high electrical current without generating too high temperature on each of the conductive plates 210.

In the preferred embodiment of the present invention, the circuit boards 2 further comprises a plurality of electric components 22, wherein an operator can insert a plurality of pins 220 of each of the electric components 22 into each of the first and second insertion holes 201, 212 in turn, respectively. Meanwhile, each of the pins 220 of each of the electric components 22 can be welded from a position of the conductive plate 210 corresponding to each of the second insertion holes 212. Alternatively, the operator can insert each of the pins 220 of each of the electric components 22 into each of the second and first insertion holes 212, 201 in turn, respectively, so that each of the pins 220 of each of the electric components 22 can be welded from a position of the insulation plate 20 corresponding to each of the first insertion holes 201. As a result, each of the electric components 22 can be welded on at least two of the conductive plates 210, so that each of the electric components 22 can be matched with each of the conductive plates 210 to form a complete circuit layout on the circuit board 2.

Referring still to FIG. 1, in the preferred embodiment of the present invention, the insulation plate 20 further comprises a plurality of first positioning portions 202. Referring to FIG. 2, each of the conductive plates 210 further comprises a plurality of second positioning portions 213, wherein each of the second positioning portions 213 is aligned with each of the first positioning portions 202, and the shape of each of the second positioning portions 213 is matched with that of each of the first positioning portions 202. Therefore, when each of the conductive plates 210 is riveted on the insulation plate 20, each of the conductive plates 210 can be stably positioned on a corresponding position of the insulation plate 20, so that the second insertion holes 212 of each of the conductive plates 210 can be surely aligned with the first insertion holes 201 of the insulation plate 20, while the pins 220 of each of the electric components 22 can smoothly pass through each of the first and second insertion holes 201, 212 for executing a welding process. As a result, each of the first and second positioning portions 202, 213 can efficiently increase the manufacture quality and yield of the circuit board 2.

In the preferred embodiment of the present invention, steps of a manufacturing method of the circuit board 2 are described more detailed hereinafter, wherein some process steps which may be simultaneously executed are further integrated into one step.

Figure 3:
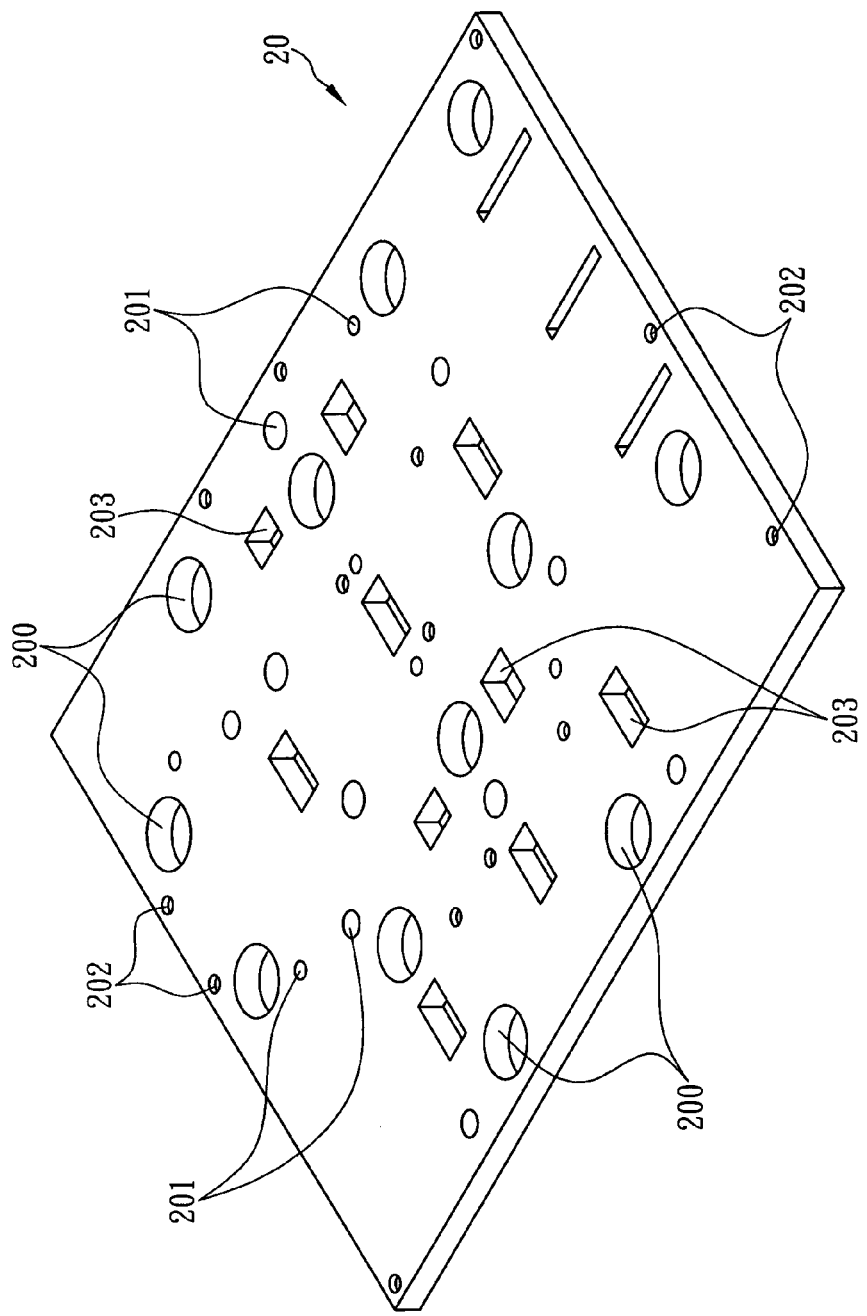
FIG. 3 is a perspective view of an insulation plate according to the preferred embodiment of the present invention.

(1) Referring to FIG. 3, drilling the insulation plate 20 to form each of the first riveting portions 200, the first insertion holes 201, the first positioning portions 202 and a plurality of cutting holes 203;

(2) Referring back to FIG. 2, cutting the metal plate 21 to form the shape of a plurality of the conductive plates 210, wherein any two of the adjacent conductive plates 210 are connected to each other by a connection portion 214; and then punching the metal plate 21 to form each of the second riveting portion 211, the second insertion hole 212 and the second positioning portions 213; and (3) Referring back to FIG. 1, riveting the cut and punched metal plate 21 (as shown in FIG. 2) to the insulation plate 20 for aligning each of the connection portions 214 with each of the cutting holes 203, and then cutting each of the connection portions 214 from each of the cutting holes 203 of the insulation plate 20, so as to form each of the independent conductive plates 210 on the insulation plate 20.

According to the foregoing steps, the manufacturing method of the circuit board 2 capable of loading high electrical current of the present invention before the circuit board 2 installs the electric components 22 only comprises three steps, which is substantially less than the eight steps of the traditional printed circuit board. The operator can easily mount each of the conductive plates 210 on the insulation plate 20 by riveting to form the circuit board 2, so as to efficiently reduce the complicated steps of the traditional printed circuit board including exposure, development and etching, all of which can not be simultaneously executed to form the finished product of the printed circuit board. As a result, the manufacture efficiency of the circuit board 2 by manufacturers can be efficiently increased, while the market competitiveness of the sale price of the circuit board 2 can be substantially improved.

As described above, referring back to FIG. 1, the present invention can mainly simplify the manufacturing process of the circuit board 2, and allows the circuit board 2 to load high electrical current without generating high temperature on each of the conductive plates 210.

The present invention has been described with a preferred embodiment thereof and it is understood that many changes and modifications to the described embodiment can be carried out without departing from the scope and the spirit of the invention that is intended to be limited only by the appended claims.

What is claimed is:

1. A circuit board capable of loading high electrical current, comprising:
   an insulation plate formed with a plurality of first riveting portions and a plurality of first insertion holes; and
   a plurality of conductive plates formed by punching and cutting a metal plate, wherein each of the conductive plates is formed with at least one second riveting portion, and each of the second riveting portions is configured to match each of the first riveting portions to combine with each other, so that each of the conductive plates is allowed to be positioned on the insulation plate; and wherein each of the conductive plates further comprises at least one second insertion hole, each of which is aligned with each of the corresponding first insertion holes, and a shape of each of the second insertion holes is matched with that of each of the corresponding first insertion holes, so that each of the first and second insertion holes of the circuit board is allowed to be welded with a plurality of electric components.

2. The circuit board capable of loading high electrical current according to claim 1, wherein each of the plurality of electric components has a plurality of pins which is configured to be inserted into each of the first and second insertion holes in turn, respectively, so that each of the electric components is allowed to be welded on at least two of the conductive plates.

3. The circuit board capable of loading high electrical current according to claim 1, wherein each of the plurality of electric components has a plurality of pins which is configured to be inserted into each of the second and first insertion holes in turn, respectively, so that each of the electric components is allowed to be welded on at least two of the conductive plates.

4. The circuit board capable of loading high electrical current according claim 1, wherein the insulation plate further comprises a plurality of first positioning portions, while each of the conductive plates further comprises a plurality of second positioning portions, wherein each of the second positioning portions is aligned with each of the first positioning portions, and the shape of each of the second positioning portions is matched with that of each of the first positioning portions, so that each of the conductive plates is allowed to be positioned on a corresponding position of the insulation plate.

5. The circuit board capable of loading high electrical current according claim 2, wherein the insulation plate further comprises a plurality of first positioning portions, while each of the conductive plates further comprises a plurality of second positioning portions, wherein each of the second positioning portions is aligned with each of the first positioning portions, and the shape of each of the second positioning portions is matched with that of each of the first positioning portions, so that each of the conductive plates is allowed to be positioned on a corresponding position of the insulation plate.

6. The circuit board capable of loading high electrical current according claim 3, wherein the insulation plate further comprises a plurality of first positioning portions, while each of the conductive plates further comprises a plurality of second positioning portions, wherein each of the second positioning portions is aligned with each of the first positioning portions, and the shape of each of the second positioning portions is matched with that of each of the first positioning portions, so that each of the conductive plates is allowed to be positioned on a corresponding position of the insulation plate.

* * * * *